United States Patent [19]

Gotou

[11] Patent Number: 5,051,952

[45] Date of Patent: Sep. 24, 1991

[54] SEMICONDUCTOR MEMORY DEVICE HAVING CAPACITORS THROUGH WHICH DATA READ/WRITE IS CARRIED OUT

[75] Inventor: Hiroshi Gotou, Niiza, Japan

[73] Assignee: Fujitsu Limited, Kawasaki, Japan

[21] Appl. No.: 588,629

[22] Filed: Sep. 25, 1990

[30] Foreign Application Priority Data

Sep. 29, 1989 [JP] Japan .................................. 1-252072

[51] Int. Cl.$^5$ ............................................ G11C 11/40
[52] U.S. Cl. ...................................... 365/154; 365/190
[58] Field of Search ............... 365/149, 150, 154, 190, 365/205; 307/272.2, 291, 355, 530

[56] References Cited

U.S. PATENT DOCUMENTS

| | | | |
|---|---|---|---|
| 3,281,630 | 10/1966 | Liang | 307/291 |
| 3,363,115 | 1/1968 | Stephenson et al. | 307/291 |
| 4,719,600 | 1/1988 | Huffman et al. | 307/530 |
| 4,858,195 | 8/1989 | Soneda | 365/205 |

Primary Examiner—Terrell W. Fears
Assistant Examiner—Jack A. Lane
Attorney, Agent, or Firm—Armstrong, Nikaido, Marmelstein, Kubovcik & Murray

[57] ABSTRACT

A semiconductor memory device includes at least one memory cell having first and second nodes, a pair of bit lines coupled to the memory cell, a first power line which is coupled to the memory cell for supplying a first power source voltage, and a second power line which is coupled to the memory cell for supplying a second power source voltage. The memory cell includes a first resistor connected between the first power line and the first node, a first transistor connected between the first node and the second power line, a second resistor connected between the first power line and the second node, a second transistor connected between the second node and the second power line, a first capacitor connected between one of the bit lines and the first node, and a second capacitor connected between the other of the bit lines and the second node. The first transistor has a gate which is connected to the second node, and the second transistor has a gate which is connected to the first node. One of the first and second power lines is used in common as a word line.

29 Claims, 16 Drawing Sheets

SEMICONDUCTOR MEMORY DEVICE HAVING CAPACITORS THROUGH WHICH DATA READ/WRITE IS CARRIED OUT

BACKGROUND OF THE INVENTION

The present invention generally relates to semiconductor memory devices, and more particularly to a static random access memory (SRAM) in which a memory cell occupies a small area in a plan view of the memory cell.

Presently, there are demands to further improve the integration density of semiconductor memory devices. In the case of the SRAM, however, it is difficult to satisfy such demands due to the large number of transistors used in the SRAM. Accordingly, there is a need to reduce the number of transistors and arrange elements of the SRAM at locations such that the further improvement of the integration density becomes possible.

FIG. 1 shows an essential part of a conventional SRAM. A memory cell part of the SRAM shown in FIG. 1 includes transistors Q1 and Q2 for holding data, load resistors R1 and R2, transistors Q3 and Q4 which are used as transfer gates, a sense amplifier SA, bit lines BL and $\overline{BL}$, and a word line WL. $V_{DD}$ denotes a positive power source voltage and $V_{SS}$ denotes a negative power source voltage. This SRAM thus uses four transistors and two resistors.

On the other hand, there is a known SRAM which uses transistors in place of the load resistors R1 and R2 in FIG. 1. Hence, this known SRAM uses six transistors.

Furthermore, there is another known SRAM which is designed to reduce both power consumption and noise. This other known SRAM uses two complementary metal oxide semiconductor (CMOS) inverters which respectively have an n-channel transistor and a p-channel transistor, and two transistors.

The SRAMs of the types described above use the bit line pair BL and $\overline{BL}$, and thus, it is possible to omit one of the bit line pair BL and $\overline{BL}$ and accordingly omit one transistor which functions as the transfer gate.

Compared to a dynamic random access memory (DRAM), however, the SRAMs described above use a large number of transistor per memory cell. For this reason, it is difficult to reduce the area occupied by the SRAM in the plan view.

If some sacrifices are made, it is possible to realize a memory cell made up of three transistors and two resistors, and a memory cell made up of two CMOS inverters and one transistor. However, up to the present, there has not been proposed a practical memory cell which is made up of two transistors or made up of two CMOS inverters.

SUMMARY OF THE INVENTION

Accordingly, it is a general object of the present invention to provide a novel and useful semiconductor memory device in which the problems described above are eliminated.

Another and more specific object of the present invention is to provide a semiconductor memory device comprising at least one memory cell having first and second nodes, a pair of bit lines coupled to the memory cell, a first power line which is coupled to the memory cell for supplying a first power source voltage, and a second power line which is coupled to the memory cell for supplying a second power source voltage, where the memory cell includes a first resistor connected between the first power line and the first node, a first transistor connected between the first node and the second power line, a second resistor connected between the first power line and the second node, a second transistor connected between the second node and the second power line, a first capacitor connected between one of the bit lines and the first node, and a second capacitor connected between the other of the bit lines and the second node, the first transistor has a gate which is connected to the second node, the second transistor has a gate which is connected to the first node, and one of the first and second power lines is used in common as a word line. According to the semiconductor memory device of the present invention, it is unnecessary to provide a transfer gate which is used in the conventional semiconductor memory device. In addition, the number of transistors used is reduced, and it is possible to improve the integration density of the semiconductor memory device.

Still another object of the present invention is to provide a semiconductor memory device comprising at least one memory cell having first and second nodes, a pair of bit lines coupled to the memory cell, a first power line which is coupled to the memory cell for supplying a first power source voltage, and a second power line which is coupled to the memory cell for supplying a second power source voltage, where the memory cell includes a first transistor connected between the first power line and the first node, a second transistor coupled between the first node and the second power line, a third transistor connected between the first power line and the second node, a fourth transistor coupled between the second node and the second power line, a first capacitor connected between one of the bit lines and the first node, and a second capacitor connected between the other of the bit lines and the second node, the second transistor has a gate which is connected to the second node, the fourth transistor has a gate which is connected to the first node, and one of the first and second power lines is used in common as a word line.

A further object of the present invention is to provide a semiconductor memory device comprising a plurality of memory cells each having first and second nodes and divided into a plurality of groups, where each of the groups include a predetermined number of the memory cells, a pair of main bit lines coupled to the memory cells, a plurality of first power lines which are respectively coupled to the memory cells for supplying a first power source voltage, a plurality of second power lines which are respectively coupled to the memory cells for supplying a second power source voltage, a plurality of sub bit line pairs respectively connected to the memory cells, where each of the sub bit line pairs are connected to a corresponding one of the groups, a plurality of sub word lines provided in correspondence with the groups, and transfer gate means coupled to the sub word lines for connecting one of the sub bit line pairs to the main bit lines responsive to signals on the sub word lines. Each of the memory cells include a first resistor connected between one first power line and the first node, a first transistor connected between the first node and one second power line, a second resistor connected between the one first power line and the second node, a second transistor connected between the second node and the one second power line, a first capacitor connected between one of the bit lines and the first node, and a second capacitor connected between the other of the bit lines and the second node, the first transistor has a gate which is connected to the second node, the second transistor has a gate which is connected to the first node, and one of the one first power line and the one second power line is used in common as a main word line.

Another object of the present invention is to provide a semiconductor memory device comprising a plurality of memory cells each having first and second nodes and divided into a plurality of groups, where each of the groups include a predetermined number of the memory cells, a pair of main bit lines coupled to the memory cells, a plurality of first power lines which are respectively coupled to the memory cells for supplying a first power source voltage, a plurality of second power lines which are respectively coupled to the memory cells for supplying a second power source voltage, a plurality of sub bit line pairs respectively connected to the memory cells, where each of the sub bit line pairs are connected to a corresponding one of the groups, a plurality of sub word lines provided in correspondence with the groups, and transfer gate means coupled to the sub word lines for connecting one of the sub bit line pairs to the main bit lines responsive to signals on the sub word lines. Each of the memory cells include a first transistor connected between one first power line and the first node, a second transistor connected between the first node and one second power line, a third transistor connected between the one first power line and the second node, a fourth transistor connected between the second node and the one second power line, a first capacitor connected between one of the bit lines and the first node, and a second capacitor connected between the other of the bit lines and the second node, the second transistor has a gate which is connected to the second node, the fourth transistor has a gate which is connected to the first node, and one of the one first power line and the one second power line is used in common as a main word line.

Still another object of the present invention is to provide a semiconductor memory device comprising a plurality of memory cells each having first and second nodes, a pair of bit lines coupled to the memory cells, a first power line which is coupled to the memory cells for supplying a first power source voltage, a second power line which is coupled to the memory cells for supplying a second power source voltage, and a plurality of capacitors respectively connected to the bit lines between two adjacent memory cells, where each of the memory cells include a first resistor connected between the first power line and the first node, a first transistor connected between the first node and the second power line, a second resistor connected between the first power line and the second node, a second transistor connected between the second node and the second power line, a first capacitor connected between one of the bit lines and the first node, and a second capacitor connected between the other of the bit lines and the second node, the first transistor has a gate which is connected to the second node, the second transistor has a gate which is connected to the first node, and one of the first and second power lines is used in common as a main word line.

A further object of the present invention is to provide a semiconductor memory device comprising a plurality of memory cells each having first and second nodes, a pair of bit lines coupled to the memory cells, a first power line which is coupled to the memory cells for supplying a first power source voltage, a second power line which is coupled to the memory cells for supplying a second power source voltage, and a plurality of capacitors respectively connected to the bit lines between two adjacent memory cells, where each of the memory cells include a first transistor connected between the first power line and the first node, a second transistor connected between the first node and the second power line, a third transistor connected between the first power line and the second node, a fourth transistor connected between the second node and the second power line, a first capacitor connected between one of the bit lines and the first node, and a second capacitor connected between the other of the bit lines and the second node, the second transistor has a gate which is connected to the second node, the fourth transistor has a gate which is connected to the first node, and one of the first and second power lines is used in common as a main word line.

Other objects and further features of the present invention will be apparent from the following detailed description when read in conjunction with the accompanying drawings.

DESCRIPTION OF THE PREFERRED EMBODIMENTS

Figure 1:
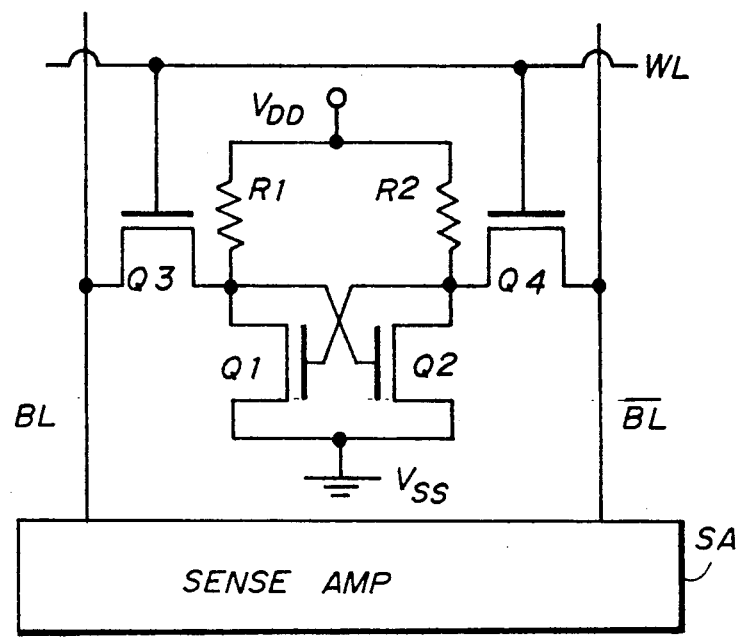
FIG. 1 is a circuit diagram showing an essential part of a conventional SRAM.
Figure 2:
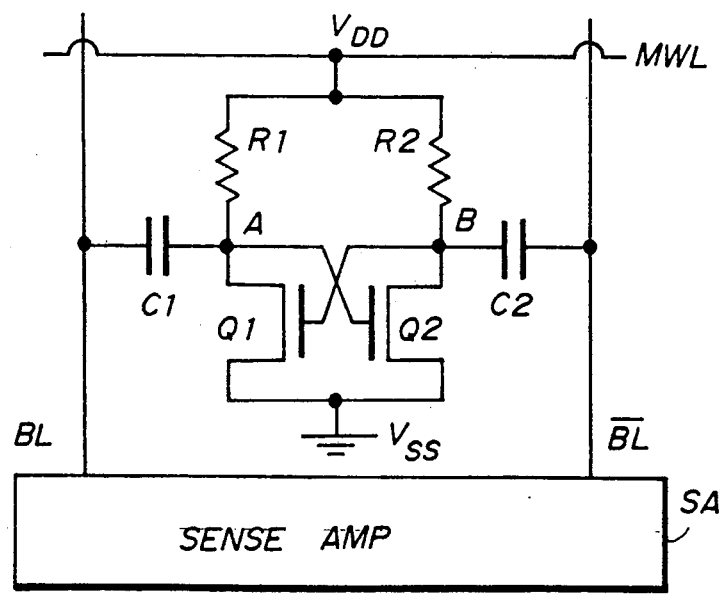
FIG. 2 is a circuit diagram showing an essential part of a first embodiment of a semiconductor memory device according to the present invention.

A description will be given of a first embodiment of a semiconductor memory device according to the present invention, by referring to FIG. 2. FIG. 2 shows an essential part of the first embodiment, that is, a memory cell part of an SRAM. In FIG. 2, those parts which are essentially the same as those corresponding parts in FIG. 1 are designated by the same reference numerals, and a description thereof will be omitted.

The memory cell part shown in FIG. 2 includes two transistors Q1 and Q2, two capacitors C1 and C2, two resistors R1 and R2, bit lines BL and $\overline{BL}$, a main word line MWL and a sense amplifier SA which are coupled as shown. The sense amplifier SA amplifies the potential difference of the bit lines BL and $\overline{BL}$. The main word line MWL is used in common as a positive power source line for supplying a positive power source voltage $V_{DD}$. For example, the transistors Q1 and Q2 are n-channel transistors.

The capacitors C1 and C2 are inserted at positions of transfer gates which are provided in the conventional memory cell. One end of the capacitor C1 is connected to the transistor Q1 which holds data, and the other end of the capacitor C1 is connected to the bit line BL. Similarly, one end of the capacitor C2 is connected to the transistor Q2 which holds data, and the other end of the capacitor C2 is connected to the bit line $\overline{BL}$. The data read/write is carried out through the capacitors C1 and C2.

Because the capacitors C1 and C2 are used in place of the conventional transfer gates, a special system is required to carry out the data read/write. On the other hand, since no transfer gates are used, there is no line which corresponds to the word line provided in the conventional SRAM. Instead, the main word line MWL is used in common as a power line which supplies the positive power source voltage $V_{DD}$. Of course, the main word line MWL may be fixed to the positive power source voltage $V_{DD}$ and use a power source line for supplying the negative power source voltage $V_{SS}$ in common as the main word line MWL. The term "positive" and "negative" power source voltages $V_{DD}$ and $V_{SS}$ are used in this specification, but it should be noted that the "positive" and "negative" power source voltages $V_{DD}$ and $V_{SS}$ are intended to mean that the power source voltage $V_{DD}$ is positive (or high) relative to the power source voltage $V_{SS}$, that is, the power source voltage $V_{SS}$ is negative (or low) relative to the power source volta $V_{DD}$.

The data read operation is carried out as follows. That is, a voltage applied to the main word line MWL is changed. Responsive to this change in the voltage of the main word line MWL, the potential at a gate electrode of only one of the transistors Q1 and Q2 changes while the potential at a gate electrode of the other remains unchanged. Hence, the information stored in the memory cell can be read out by changing the voltage applied to the main word line MWL.

The data write operation is carried out as follows. That is, the potentials at the gate electrodes of the transistors Q1 and Q2 are set approximately the same, and a current is applied to the power line, that is, the main word line MWL, after applying a potential difference across the pair of bit lines BL and $\overline{BL}$. As a result, it is possible to write the information on the bit lines BL and $\overline{BL}$ into the memory cell.

According to this embodiment, no transfer gate is required in the memory cell part. For this reason, it is possible to reduce the number of transistors required in the memory cell part. In addition, unlike transistors, the capacitors need not be formed on the surface of the semiconductor substrate and the capacitors can be formed above another element. Hence, the area exclusively occupied by the capacitor is virtually negligible in the plan view, and the integration density of the SRAM can be greatly improved.

Figure 3:
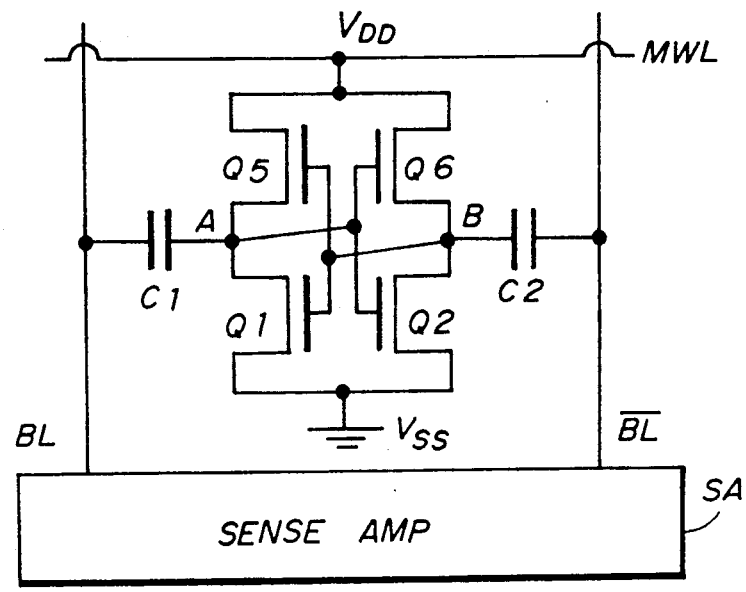
FIG. 3 is a circuit diagram showing an essential part of a second embodiment of the semiconductor memory device according to the present invention.

Next, a description will be given of a second embodiment of the semiconductor memory device according to the present invention, by referring to FIG. 3. FIG. 3 shows an essential part of the second embodiment, that is, a memory cell part of an SRAM. In FIG. 3, those parts which are essentially the same as those corresponding parts in FIG. 2 are designated by the same reference numerals, and a description thereof will be omitted.

The memory cell part shown in FIG. 3 includes four transistors Q1, Q2, Q5 and Q6, two capacitors C1 and C2, bit lines BL and $\overline{BL}$, a main word line MWL and a sense amplifier SA which are coupled as shown. The main word line MWL is used in common as a positive power source line for supplying a positive power source voltage $V_{DD}$. For example, the transistors Q1 and Q2 are n-channel transistors, and the transistors Q5 and Q6 are p-channel transistors. The transistors Q1 and Q5 form a CMOS inverter, and the transistors Q2 and Q6 form another CMOS inverter. The transistors Q5 and Q6 are inserted in place of the resistors R1 and R2 shown in FIG. 2.

The data read/write is carried out similarly as in the first embodiment described above.

In order to reduce the bit line capacitance, it is possible to connect a small number of memory cells to a pair of sub bit lines to form a sub group. A collection of such sub groups may be coupled to main bit lines by coupling the sub bit lines to the main bit lines via transfer gate transistors. In this case, the transfer gate transistors are driven by sub word lines.

Figure 4:
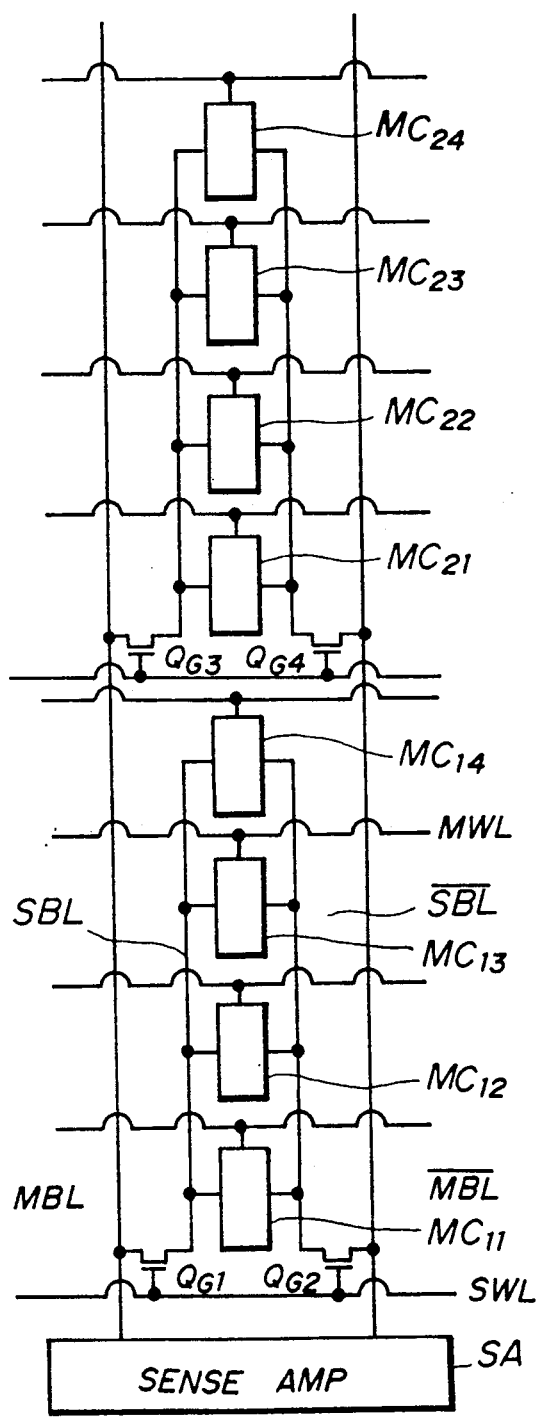
FIG. 4 is a circuit diagram showing an essential part of a third embodiment of the semiconductor memory device according to the present invention.

Next, a description will be given of a third embodiment of the semiconductor memory device according to the present invention, by referring to FIG. 4. FIG. 4 shows an essential part of the third embodiment.

The semiconductor memory device shown in FIG. 4 includes memory cells MC$_{11}$ through MC$_{14}$, memory cells MC$_{21}$ through MC$_{24}$, main bit lines MBL and $\overline{MBL}$, sub bit lines SBL and $\overline{SBL}$, a sub word line SWL, and transfer gate transistors Q$_{G1}$ through Q$_{G4}$ which are connected as shown.

Figure 5:
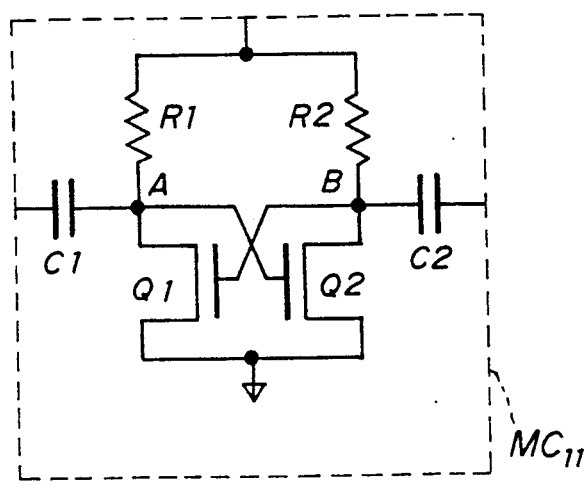
FIG. 5 is a circuit diagram showing a memory cell of the third embodiment shown in FIG. 4.

FIG. 5 shows a circuit structure of the memory cell MC$_{11}$ shown in FIG. 4. In FIG. 5, those parts which are the same as those corresponding parts in FIG. 2 are designated by the same reference numerals, and a description thereof will be omitted. The other memory cells MC$_{12}$ through MC$_{14}$ and MC$_{21}$ through MC$_{24}$ have the same circuit structure.

Figure 6:
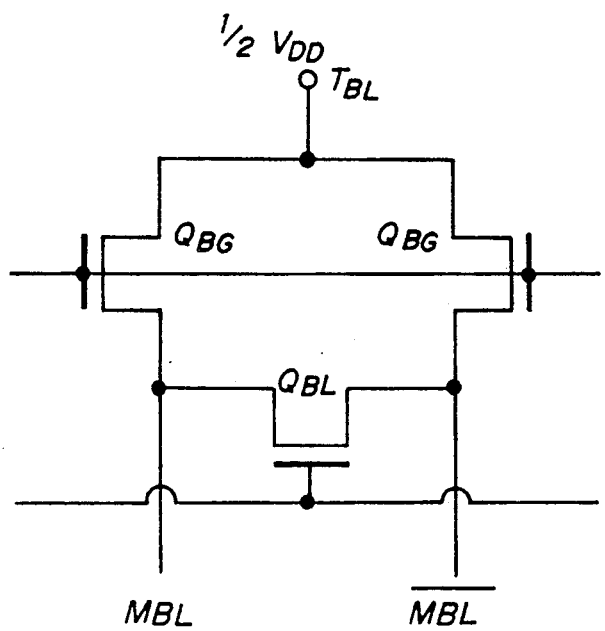
FIG. 6 is a circuit diagram showing an essential part of a bit line potential adjusting circuit of the third embodiment shown in FIG. 4.

FIG. 6 shows an essential part of a bit line potential adjusting circuit which is not shown in FIG. 4 but is coupled to the main bit lines MBL and $\overline{\text{MBL}}$ on an end opposite to the end where the sense amplifier SA is provided in FIG. 4. A voltage V$_{DD}$/2 is supplied to a terminal T$_{BL}$, and the bit line potential adjusting circuit includes switching transistors Q$_{BG}$ for controlling the supply of voltage and a transistor Q$_{BL}$ for leveling the voltage.

Figure 7A:
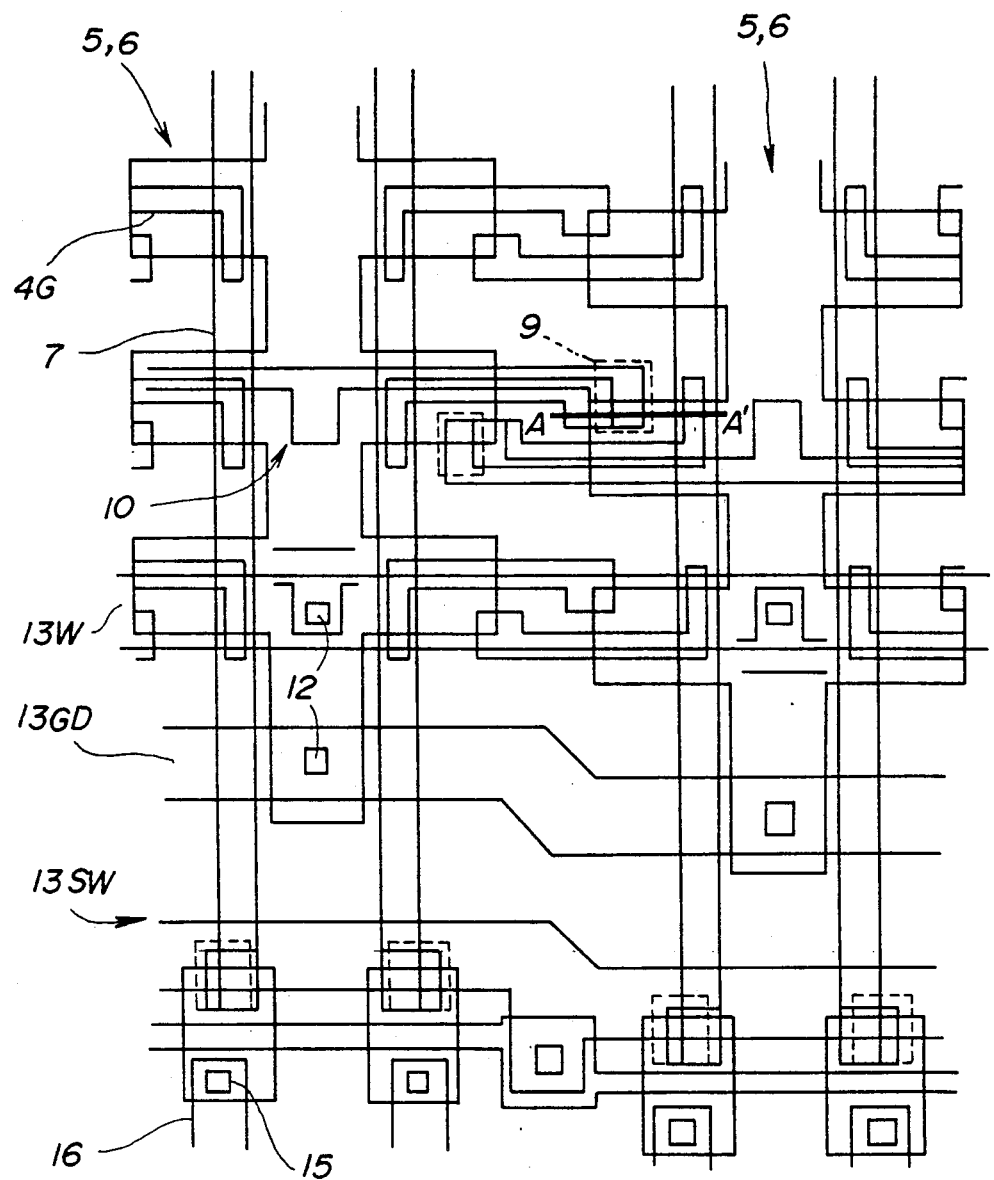
FIGS. 7A and 7B are a plan view and a cross sectional view respectively showing an essential part of the third embodiment in a vicinity of the memory cell.
Figure 7B:
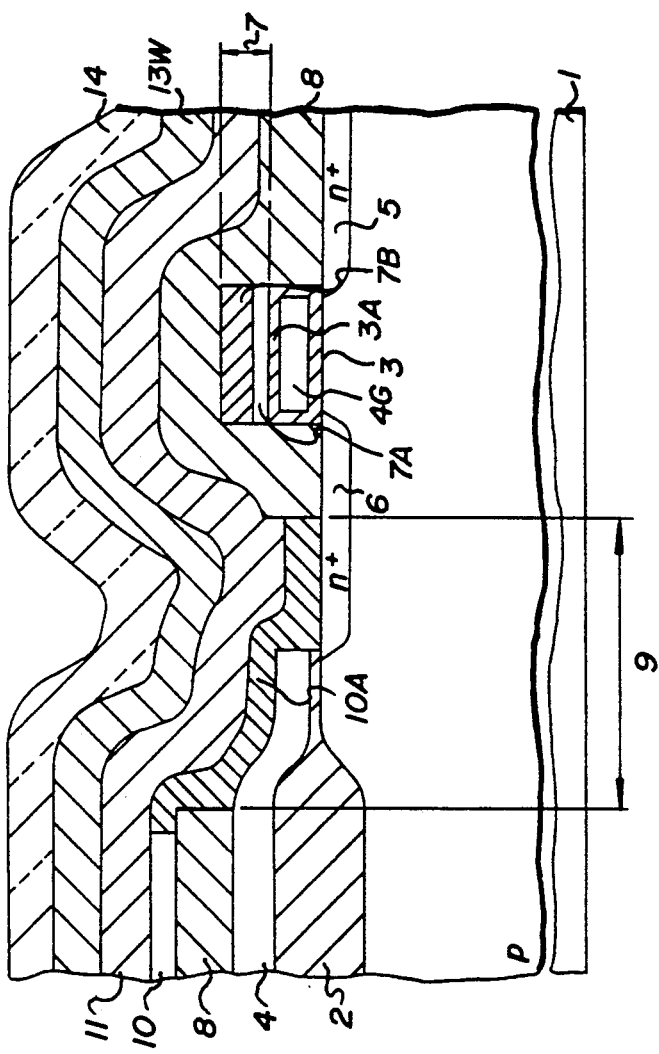

FIG. 7A is a plan view showing an essential part of the third embodiment, and FIG. 7B is a cross sectional view along a line A—A' in FIG. 7A. A description will now be given of a method of producing the third embodiment of the semiconductor memory device according to the present invention, by referring to FIGS. 7A and 7B. This method generally is made up of steps (1) to (?2).

Step (1): For example, a local oxidation of silicon (LOCOS) using a oxidation-resistant mask such as a Si$_3$N$_4$ layer is employed to form a field insulator layer 2 made of SiO$_2$ on a surface of a semiconductor substrate 1 which is made of p-type Si.

Step (2): After the LOCOS, the oxidation-resistant mask is removed to expose an active region of the semiconductor substrate 1. A thermal oxidation is used to form a gate insulator layer 3 which is made of SiO$_2$ to a thickness of 300 Å, for example, within a dry atmosphere.

Step (3): A chemical vapor deposition (CVD) is used to grow a polysilicon layer 4 to a thickness of 0.5 μm, for example.

Step (4): For example, a reactive ion etching (RIE) using CF$_4$ as etching gas is used to pattern the polysilicon layer 4 so as to form a gate electrode 4G.

Step (5): As ions are implanted into the semiconductor substrate 1 by an ion implantation at a dosage of $5 \times 10^{15}$ cm$^{-2}$ and an acceleration energy of 100 keV, for example, so as to form basis for an n$^+$-type source region 5 and an n$^+$-type drain region 6. These regions 5 and 6 are realized by an appropriate thermal process which is carried out afterwards.

Step (6): A thermal oxidation is used to form an insulator layer 3A which is made of SiO$_2$ and has a thickness of 300 Å, for example, on the polysilicon layer such as the gate electrode 4G, within a dry atmosphere.

Step (7): A CVD is used to form a polysilicon layer 7A to a thickness of 2000 Å, for example, and to form a WSi$_2$ layer 7B to a thickness of 3000 Å, for example.

Step (8): A polycide layer made up of the polysilicon layer 7A and the WSi$_2$ layer 7B is patterned to form a sub bit line 7 by a resist process of a photolithography technique and a RIE using CF$_4$+O$_2$ as etching gas.

Step (9): A CVD is used to form an interlayer insulator 8 which is made of SiO$_2$ and has a thickness of 1000 Å, for example.

Step (10): The interlayer insulator 8 is selectively etched and an electrode contact hole 9 is formed by a resist process of a photolithography technique and a RIE using CF$_4$ or CF$_4$+O$_2$ as etching gas.

Step (11): A CVD is used to form an undoped high-resistivity polysilicon layer 10 having a thickness of 2000 Å, for example.

Step (12): A photoresist layer (not shown) having a hole corresponding to the electrode contact hole 9 is formed by a resist process of a photolithography technique, and an ion implantation is carried out using this photoresist layer as a mask. P ions are selectively implanted into the high-resistivity polysilicon layer 10 by the ion implantation so as to form a low-resistivity part 10A. For example, the dosage and acceleration energy of this ion implantation respectively are $1 \times 10^{15}$ cm$^{-2}$ and 50 keV.

Step (13): The high-resistivity polysilicon layer 10 is patterned by a resist process of a photolithography technique and a RIE using CF$_4$ as etching gas.

Step (14): A CVD is used to form an interlayer insulator 11 which is made up of a SiO$_2$ layer having a thickness of 0.5 μm, for example, and a phosphosilicate glass (PSG) layer having a thickness of 0.5 μm, for example.

Step (15): The interlayer insulator 11 is selectively etched to form an electrode contact hole 12 by a resist process of a photolithography technique and a RIE using CF$_4$+O$_2$ as etching gas.

Step (16): A magnetron sputtering is used to form a AlSi layer on the entire substrate surface to a thickness of 1 μm, for example, where the Si content of the Alsi layer is approximately 1% to 2%.

Step (17): The Alsi layer which is formed by the step (16) is patterned bu a resist process of a photolithography technique and a RIE using CCl$_4$ as etching gas, so as to form a word line 13W, a ground line 13GD and a sub word line 13SW.

Step (18): A CVD is used to form an interlayer insulator 14 which is made up of a SiO$_2$ layer having a thickness of 0.5 μm, for example, and a PSG layer having a thickness of 0.5 μm, for example.

Step (19): The interlayer insulator 14 is selectively etched to form an electrode contact hole 15 by a resist process of a photolithography technique and a RIE using CF$_4$+O$_2$ as etching gas.

Step (20): A magnetron sputtering is used to form a AlSi layer on the entire substrate surface to a thickness of 1 μm, for example, where the Si content of the AlSi layer is approximately 1% to 2%.

Step (21): The Alsi layer which is formed by the step (20) is patterned by a resist process of a photolithography technique and a RIE using CCl$_4$ as etching gas, so as to form a main but line 16.

Step (22): A CVD is used to form a passivation layer (not shown) which is made up of a PSG layer having a thickness of 1 μm, for example, and a SiN layer having a thickness of 0.5 μm, for example.

The semiconductor memory device is completed by the above described steps (1) through (22).

In the third embodiment, the transistors Q1 and Q2 for holding data are MOS FETs, and for example, the channel length and the channel width of the MOS FET are 1 μm. In addition, the resistors R1 and R2 respectively are made of a non-doped or impurity doped polysilicon layer having a resistance of 100 MΩ, for example. Further, the capacitors C1 and C2 respectively have a capacitance in the range of 5 fF to 10 fF.

As may be seen from FIG. 7B, the capacitor C1 (or C2) which is used in place of the transfer gate transistor is formed between the gate electrode of the transistor Q1 (or Q2) and the bit line. In other words, the capacitor C1 (or C2) can be formed above the transistor Q1 (or Q2), and in the plan view of the semiconductor memory device the capacitor C1 (or C2) does not occupy an area exclusively therefor. For this reason, it is possible to improve the integration density of the semiconductor memory device, that is, the SRAM in this case.

Of course, it is possible to provide the capacitors C1 and C2 in a layer different from that of described above in conjunction with FIG. 7B.

Next, a description will be given of the operation of the third embodiment. FIG. 8(A) through 8(F) is a timing chart for explaining the read operation, and FIG. 9(A) through 9(F) is a timing chart for explaining the write operation.

Figure 8:
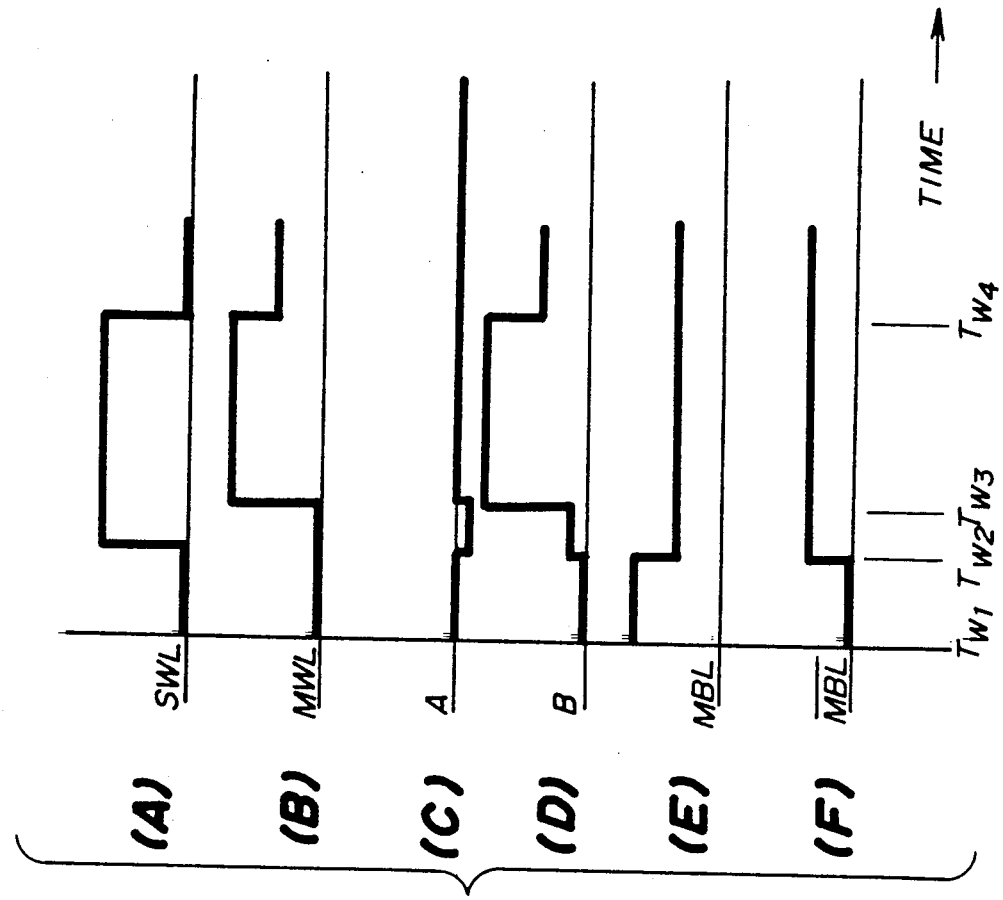
FIG. 8(A) through (F) is a timing chart for explaining a read operation.

In FIG. 8, $T_{R1}$ denotes a time when a potential of the sub word line SWL is raised so as to couple the main bit lines MBL and $\overline{MBL}$ to the sub bit lines SBL and $\overline{SBL}$, and $T_{R2}$ denotes a time when the sense amplifier SA is operated. On the other hand, in FIG. 9, $T_{W1}$ denotes a time when the main bit line MBL is set to a high level (or a low level) and the main bit line $\overline{MBL}$ is set to a low level (or a high level) depending on the write information, $T_{W2}$ denotes a time when the main bit lines MBL and $\overline{MBL}$ are short-circuited and set to an intermediate level, $T_{W3}$ denotes a time when the potential of the main word line MWL is raised to set a node A shown in FIG. 5 to a high level and a node B shown in FIG. 5 to a low level, and $T_{W4}$ denotes a time when the main word line MWL is set to a low level so as to reduce the power consumption in a standby state.

First, a description will be given of the read operation by referring to FIG. 8.

When the main word line MWL and the main bit lines MBL and $\overline{MBL}$ are not selected, the power source voltage for the memory cells $MC_{11}$, $MC_{12}$, ..., that is, the potential of the main word line MWL is set to $V_{DD}/2$. It is assumed that the level at the node A is set to the high level, and the level at the node B is set to the low level.

When the main word line MWL and the main bit lines MBL and $\overline{MBL}$ are selected, the sub word line SWL is set to a high level to turn ON the transfer gate transistors $Q_{G1}$ and $Q_{G2}$ so as to select one group of memory cells $MC_{11}$ through $MC_{14}$. As a result, the main bit line MBL is connected to the sub bit line SBL, and the main bit line $\overline{MBL}$ is connected to the sub bit line $\overline{SBL}$. The voltage applied to the main word line MWL, that is, the power source voltage applied to the memory cell $MC_{11}$, for example, is set to $V_{DD}$ so that the potential at the node A can be changed by $V_{DD}/2$ virtually without changing the potential at the node B. The potential change at the node A is transmitted to the sub bit lines SBL and $\overline{SBL}$ via the respective capacitors C1 and C2 and is thus to the main bit lines MBL and $\overline{MBL}$ to change the potentials of the main bit lines MBL and $\overline{MBL}$. Hence, the potential change of the main bit lines MBL and $\overline{MBL}$ can be detected by the sense amplifier SA. In other words, it is possible to set the main bit line MBL to the low level and set the main bit line $\overline{MBL}$ to the high level. After the potentials of the main bit lines MBL and $\overline{MBL}$ are transferred to the sense amplifier SA, the sense amplifier SA may be operated in a state where the main bit lines MBL and $\overline{MBL}$ are disconnected.

Figure 9:
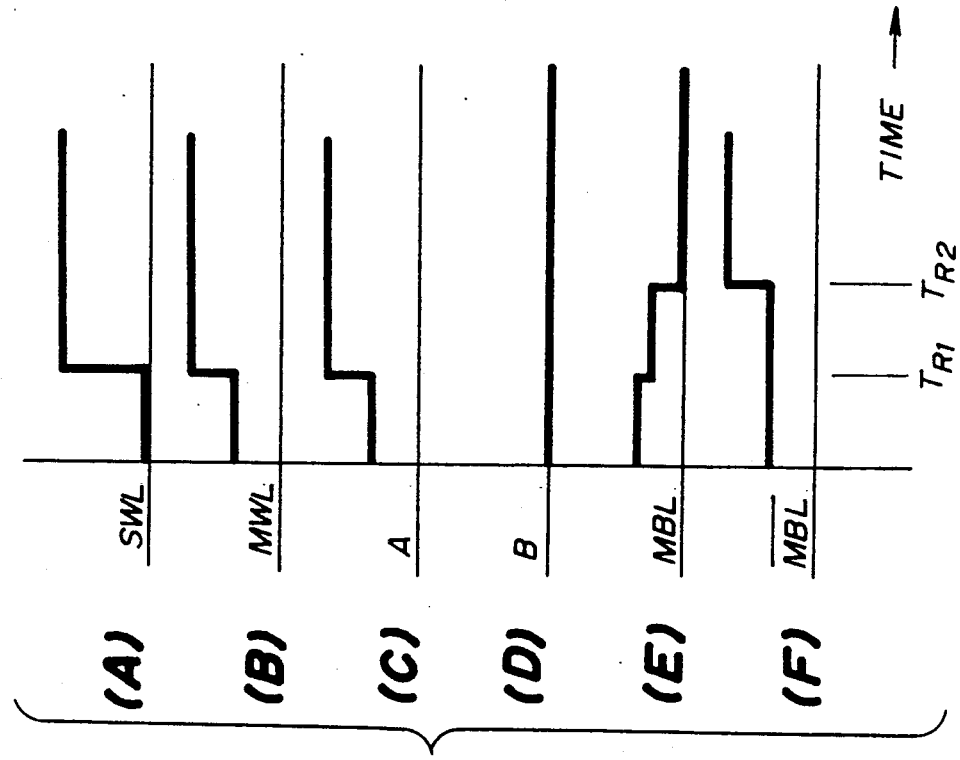
FIG. 9(A) through (F) is a timing chart for explaining a write operation.

A description will now be given of the write operation by referring to FIG. 9.

First, the power source voltage for the memory cells $MC_{11}$, $MC_{12}$, ..., that is, the potential of the main word line MWL is set to the ground potential. The main bit line MBL is set to a high level (or a low level) and the main bit line $\overline{MBL}$ is set to a low level (or a high level) depending on the write information which is to be written.

Then, the leveling transistor $Q_{BL}$ is turned ON to set the main bit lines MBL and $\overline{MBL}$ to the intermediate level. As a result, the potential at the node B slightly rises and the potential at the node A slightly falls.

Next, the potential o the main word line MWL is raised to set the node B to the high level (or low level) and the node A to the low level (or high level).

In the standby state, it is possible to reduce the power consumption by lowering the potential of the main word line MWL.

It is possible to take the following measures instead when carrying out the write operation. That is, the power source voltage for the memory cells $MC_{11}$, $MC_{12}$, ..., that is, the potential of the main word lien MWL is set to the ground potential. The main bit lines MBL and $\overline{MBL}$ are set to the intermediate level. Next, the main bit line MBL is set to the high level (or low level) and the main bit line $\overline{MBL}$ is set to the low level (or high level) depending on the write information which is to be written. Then, the potential of the main word line MWL is raised so as to set the node B (or A) to a high level.

Of course, the two methods described above may be combined when carrying out the write operation.

Figure 10:
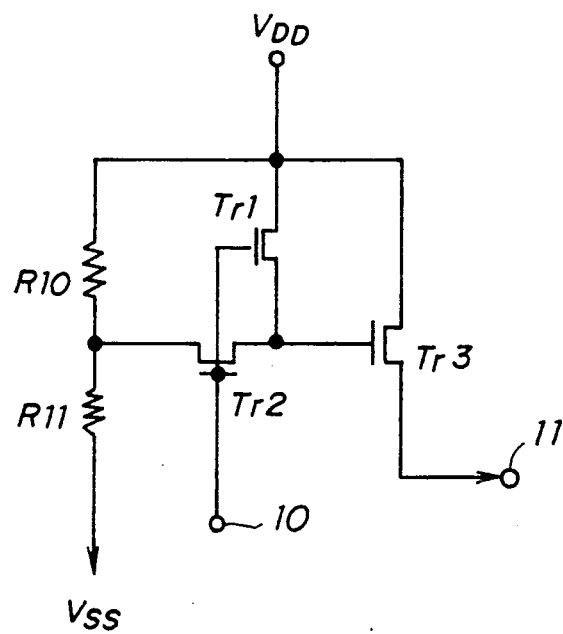
FIG. 10 is a circuit diagram showing an essential part of an embodiment of a word line driving circuit.

FIG. 10 shows an essential part of an embodiment of a word line driving circuit. The word line diving circuit shown in FIG. 10 includes a p-channel transistor Tr1, n-channel transistors Tr2 and Tr3, and resistors R10 and R11 which are connected as shown between a positive power source $V_{DD}$ and a negative power source $V_{SS}$. A switching signal is applied to a terminal 10, and an output voltage from a terminal 11 is supplied to the main word line MWL (or $\overline{MBL}$) shown in FIG. 4. When the switching signal applied to the terminal 10 has a high level, the output voltage from the terminal 11 is $V_{DD}/2$. On the other hand, the output voltage from the terminal 11 is $V_{DD}$ when the switching signal applied to the terminal 10 has a low level.

Figure 11:
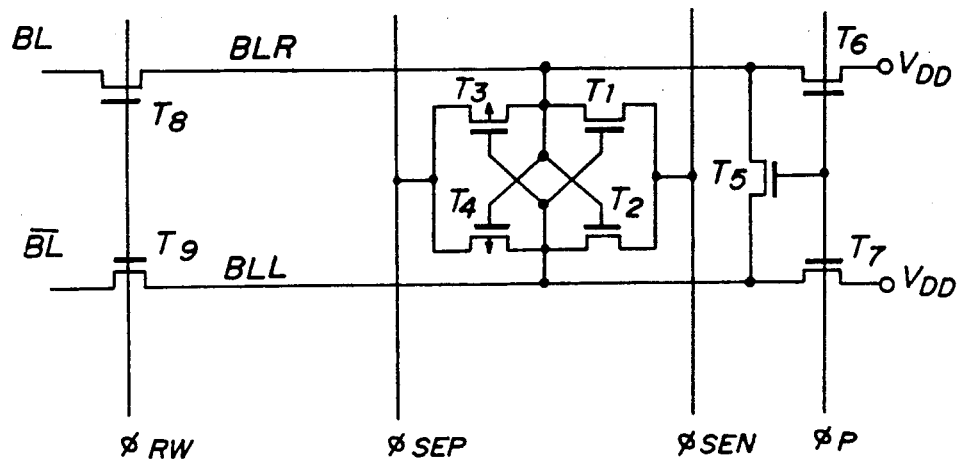
FIG. 11 is a circuit diagram showing an essential part of an embodiment of a sense amplifier.
Figure 12:
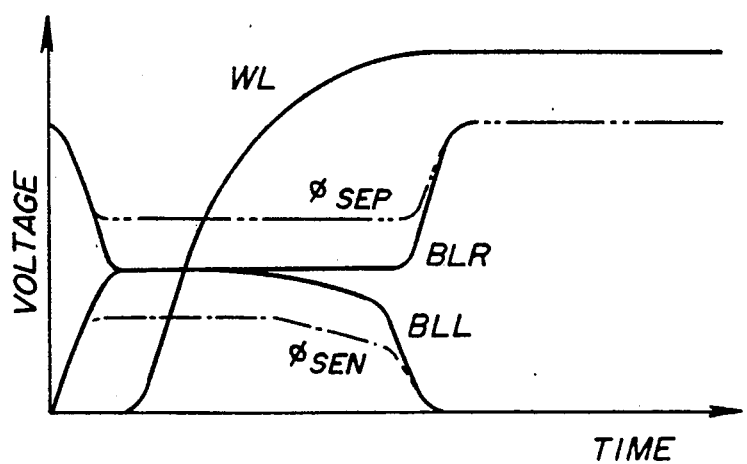
FIG. 12 is a timing chart for explaining an operation of the sense amplifier shown in FIG. 11.

FIG. 11 shows an essential part of an embodiment of the sense amplifier SA, and FIG. 12 is a timing chart for explaining the operation of the sense amplifier SA.

The sense amplifier SA shown in FIG. 11 generally includes transistors T1 through T9 which are connected as shown. $\phi_P$ denotes a precharge clock signal, $\phi_{SEN}$ denotes a common source potential of the NMOS transistors T1 and T2, and $\phi_{SEP}$ denotes a common source potential of the PMOS transistors T3 and T4. $\phi_{RW}$ denotes a read/write clock signal for controlling the ON/OFF state of the transistors T and T9.

At the start of the read operation, the read/write clock signal $\phi_{RW}$ turns the transistors T8 and T9 ON and thereafter turns the transistors T8 and T9 OFF after the sense amplifier SA senses the potential difference across the bit lines BL and $\overline{BL}$ (or BLR and BLL). As a result, a potential difference across bit lines BLR and BLL is amplified as shown in FIG. 12.

On the other hand, during the write operation, the read/write clock signal $\phi_{RW}$ controls the ON/OFF state of the transistors T8 and T9 as follows. That is, the transistors T8 and T9 are first turned OFF to set the potentials of the bit lines BL and $\overline{BL}$ to $V_{DD}/2$ via the positive power source $V_{DD}$. At the same time, the potential of the main word line MWL is lowered. Second, the transistors T8 and T9 are turned ON to latch the data to be written into the memory cell. Third, the transistors T8 and T9 are turned OFF, and at the same time, the potential of the main word line MWL is raised.

Figure 13:
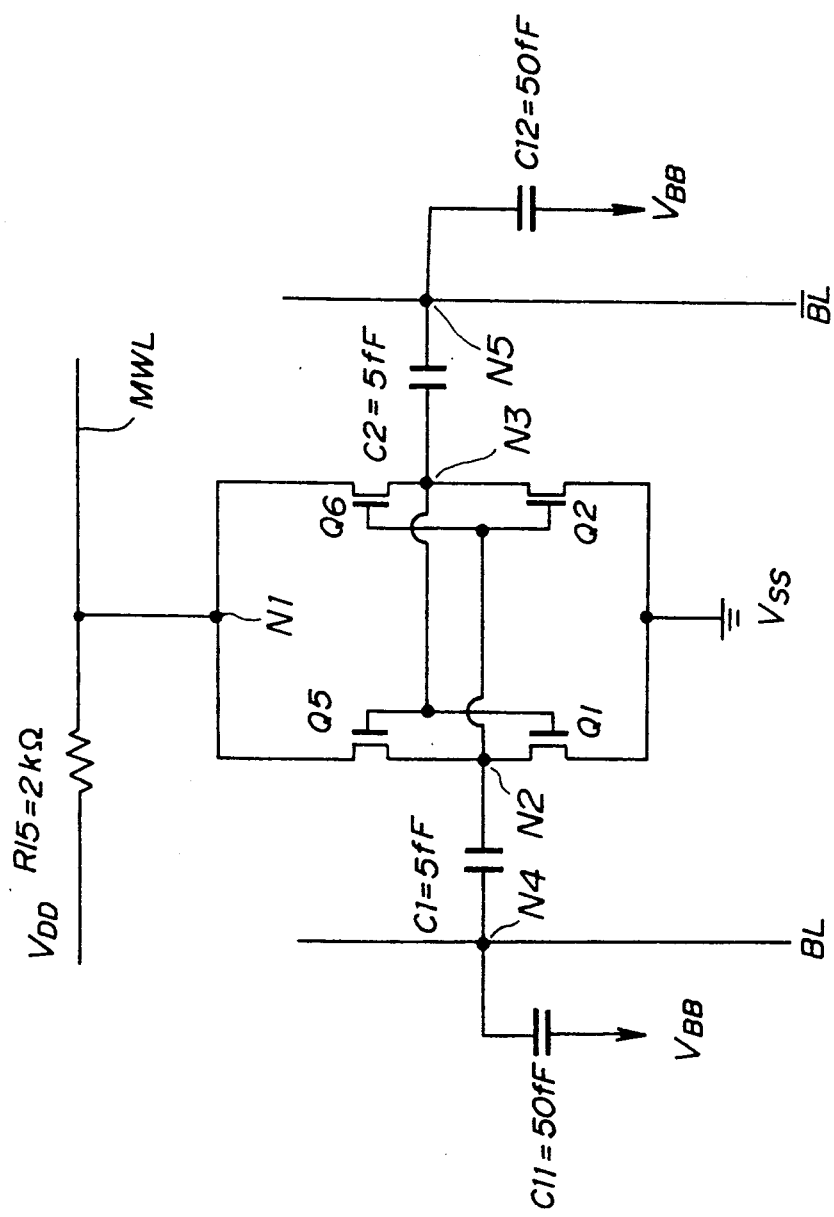
FIG. 13 is a circuit diagram for explaining a circuit structure employed for a simulation.

Next, a description will be given of a simulation which is carried out for the second embodiment. The simulation is carried out using a circuit structure shown in FIG. 13. In FIG. 13, those parts which are the same as those corresponding parts in FIG. 3 are designated by the same reference numerals, and a description thereof will be omitted.

In FIG. 13, the main word line MWL is connected to a node N1, and this node N1 is coupled to the power source voltage $V_{DD}$ via a resistor R15 having a resistance of 2 kΩ. The capacitor C1 has a capacitance of 5 fF and is connected to the bit line BL at a node N4. This node N4 is coupled to a power source voltage $V_{BB}$ via a capacitor C11 having a capacitance of 50 fF. The capacitor C2 has a capacitance of 5 fF and is connected to the bit line $\overline{BL}$ at a node N5. This node N5 is coupled to a power source voltage $V_{BB}$ via a capacitor C12 having a capacitance of 50 fF. The transistors Q1 and Q5 and the capacitor C1 are connected at a node N2. On the other hand, the transistors Q2 and Q6 and the capacitor C2 are connected at a node N3.

Figure 14:
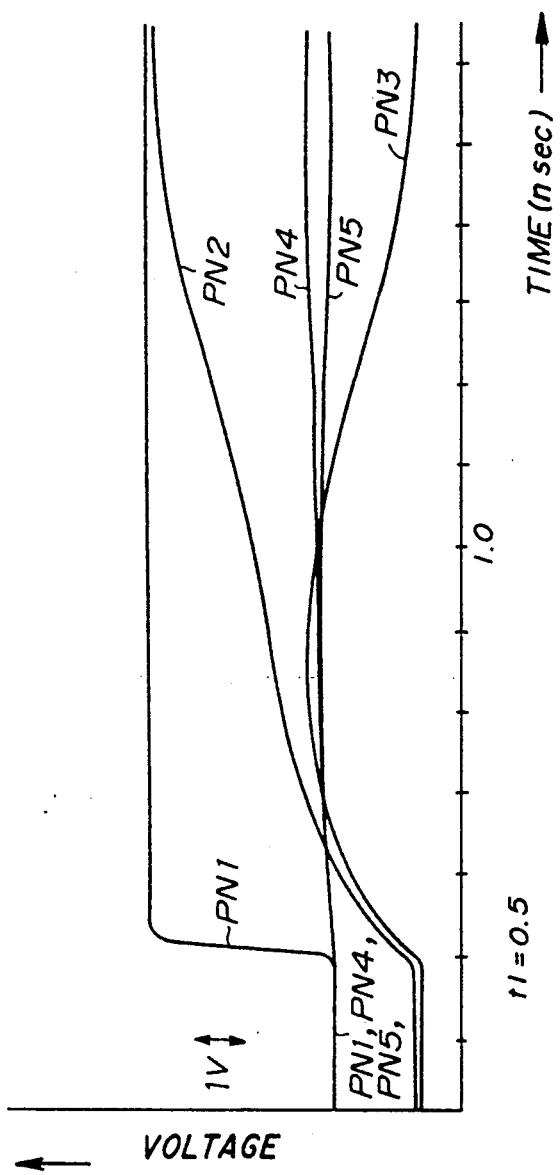
FIGS. 14 and 15 respectively are timing charts for explaining potentials at various parts of the circuit shown in FIG. 13 during a simulation of a read operation and a write operation.

FIG. 14 is a timing chart for explaining the potentials at the nodes N1 through N5 in FIG. 13 during a read operation. When a potential PN1 at the node N1 is changed from 2 V to 6 V at a time t1, potentials PN2 and PN3 at the respective nodes N2 and N3 change as shown. As a result, potentials PN4 and PN5 are obtained at the respective nodes N4 and N5.

Figure 15:
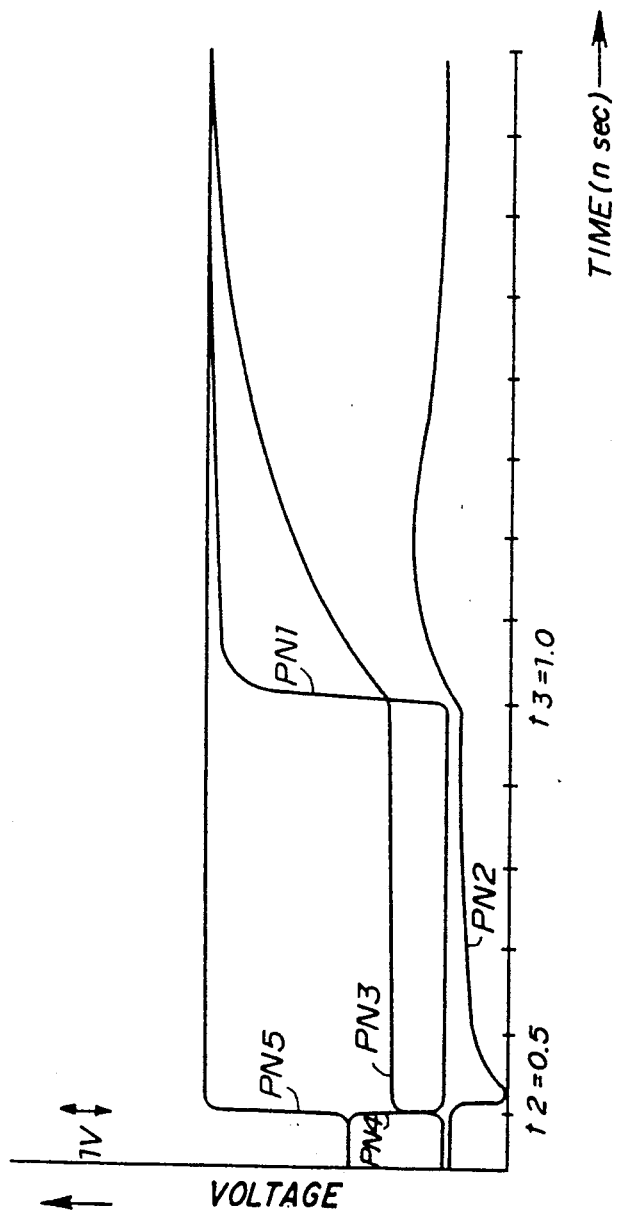

FIG. 15 is a timing chart for explaining the potentials at the nodes N1 through N5 in FIG. 13 during a write operation. Initially, the potentials PN1 through PN3 are 0 V and the potentials PN4 and PN5 are 2 V. The potential PN4 is changed from 2 V to 0 V and the potential PN5 is changed from 2 V to 5 V at a time t2. As a result, the potential PN2 slightly rises and the potential PN3 slightly falls. At a time t3, the potential PN1 is changed from 0 V to 5 V. Consequently, the potential PN3 rises to 5 V and the potential PN2 falls to 0 V, and the write operation is completed.

Figure 16:
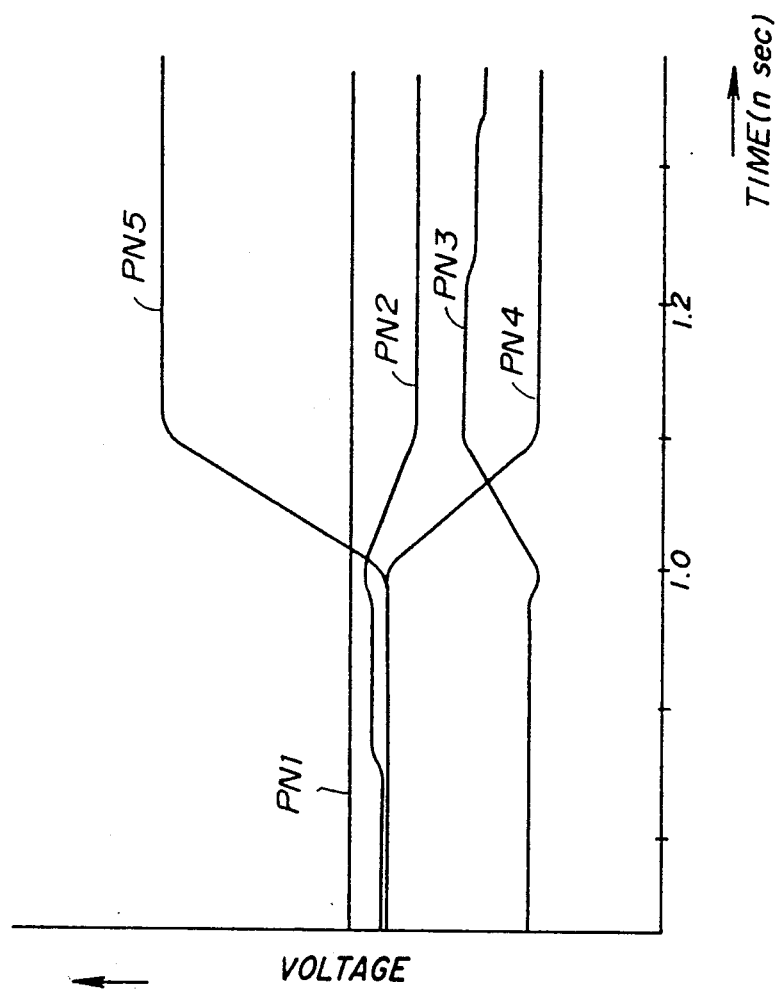
FIG. 16 is a timing chart for explaining the operation of the circuit shown in FIG. 13.

FIG. 16 is a timing chart for explaining the operation of the circuit shown in FIG. 13. The same designations are used as in FIGS. 14 and 15. It may be seen from FIG. 16 that no data write operation is carried out with respect to those memory cells which are not selected. During the read operation, even when the sense amplifier SA amplifies the potential difference across the bit lines BL and $\overline{BL}$, those memory cells which are not selected will not be inverted. On the other hand, during the read operation, even when the potentials of the pair of bit lines BL and $\overline{BL}$ are greatly changed, no data write operation takes place with respect to the memory cells which are also connected to the bit lines BL and $\overline{BL}$ but are other than the selected memory cell. For this reason, the data stored in the memory cells other than the selected memory cell will not be changed by the data write operation which is carried out with respect to the selected memory cell.

Figure 17:
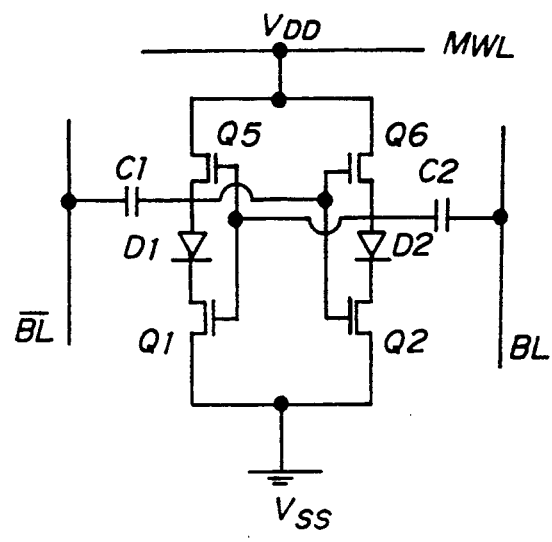
FIG. 17 is a circuit diagram showing an essential part of a fourth embodiment of the semiconductor memory device according to the present invention.
Figure 19:
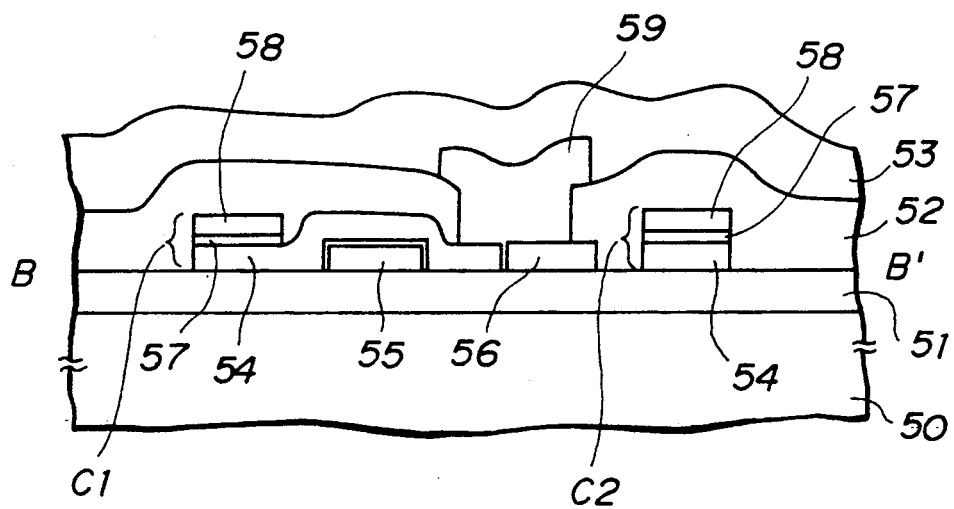
FIG. 19 is a cross sectional view of the fourth embodiment.
Figure 18:
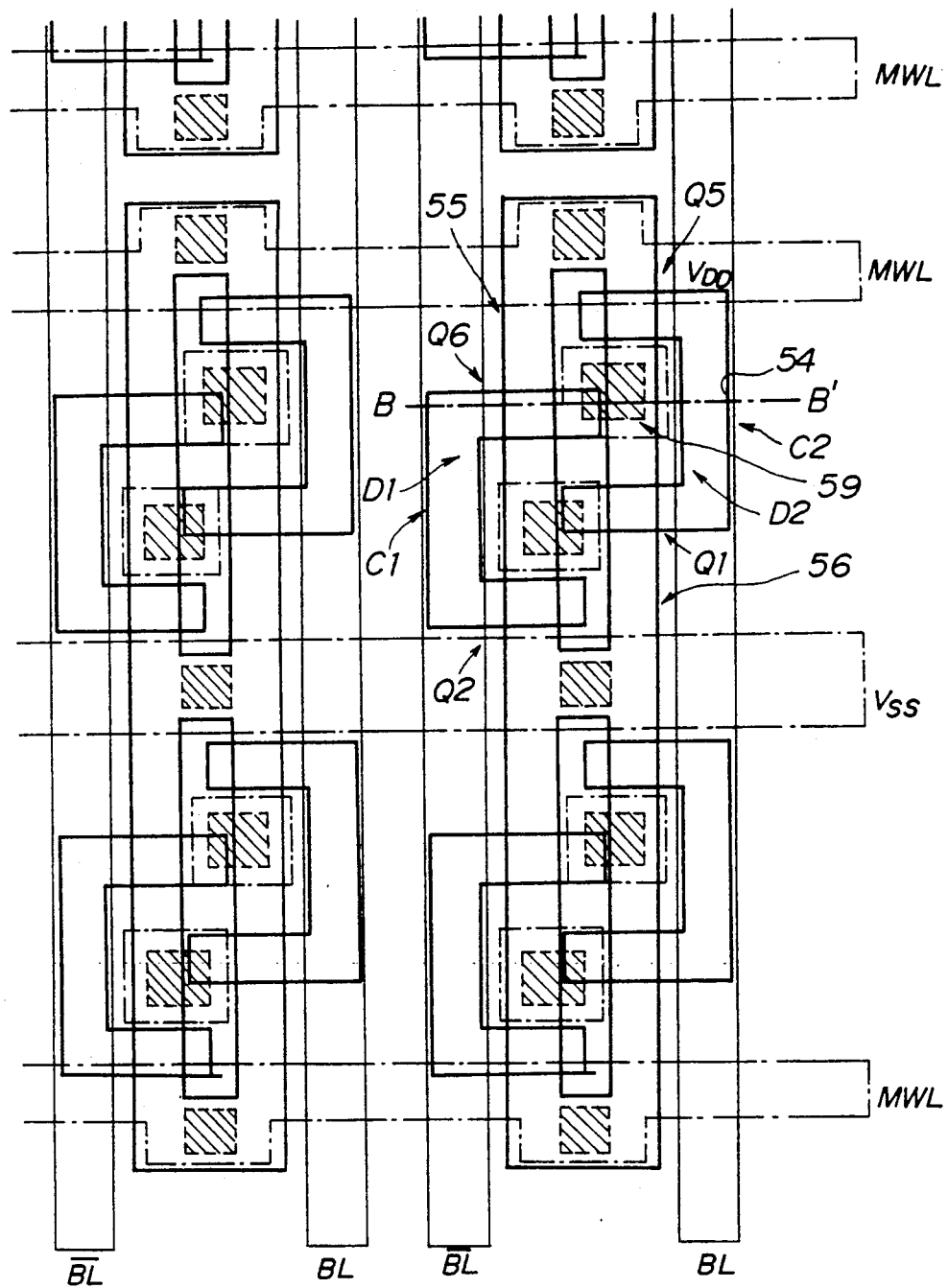
FIG. 18 is a plan view showing the fourth embodiment.

Next, a description will be given of a fourth embodiment of the semiconductor memory device according to the present invention. FIG. 17 is a circuit diagram showing an essential part of the fourth embodiment. FIG. 18 is a plan view showing the fourth embodiment together with adjacent memory cells, and FIG. 19 is a cross sectional view taken along a line B—B' in FIG. 18. In FIGS. 17 through 19, those parts which are essentially the same as those corresponding parts in FIGS. 3, 7A and 7B are designated by the same reference numerals, and a description thereof will be omitted.

In FIG. 17, a diode D1 is connected between the transistors Q1 and Q5, and a diode D2 is connected between the transistors Q2 and Q6.

As shown in FIG. 19, a $SiO_2$ insulator layer 51 is formed on a substrate 50. A gate electrode layer 54 and Si regions 55 and 56 are formed on the $SiO_2$ insulator layer 51. The Si region 55 corresponds to the source region of the transistor Q6, and the Si region 56 corresponds to the drain region of the transistor Q5. A $SiO_2$ layer 57 and a $WSi_2$ layer 58 are formed on the gate electrode layer 54. The $SiO_2$ layer 51 is covered by an interlayer insulator 51. An Al contact layer 59 connects to the Si region 56. A covering layer 53 covers the substrate surface as shown. The $WSi_2$ layer 58 shown on the left in FIG. 19 corresponds to the bit line $\overline{BL}$, and the $WSi_2$ layer 58 shown on the right corresponds to the bit line BL.

Figure 20:
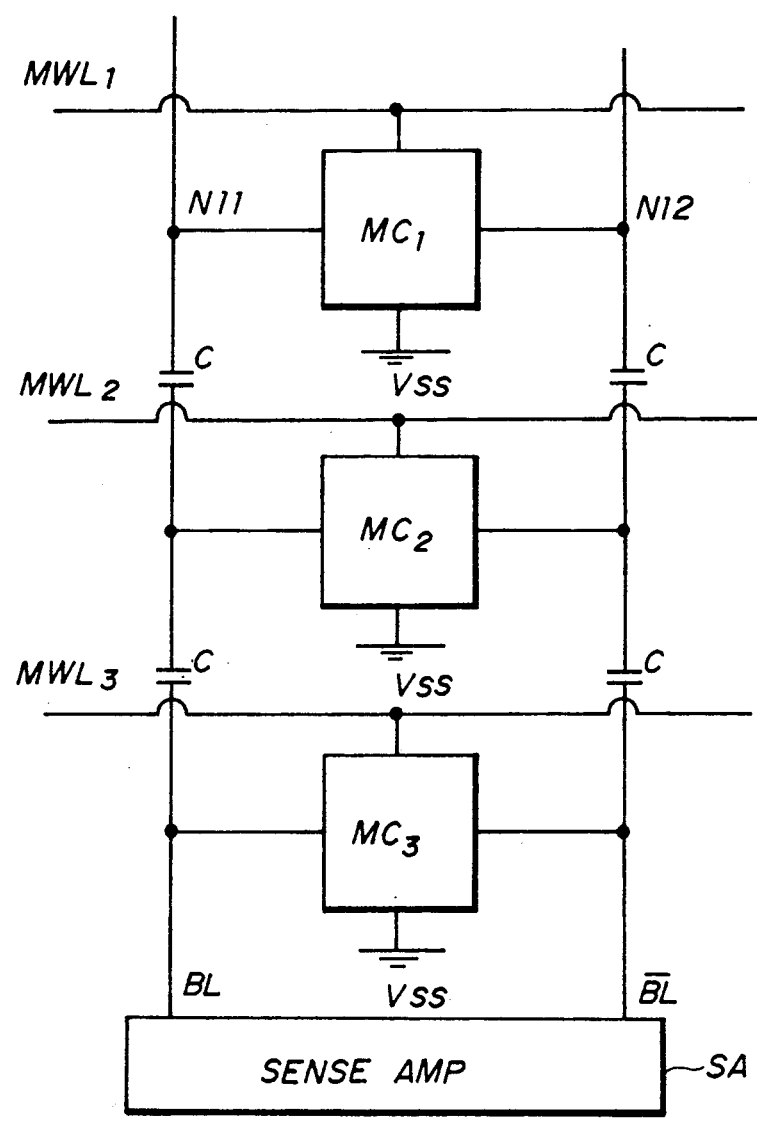
FIG. 20 is a circuit diagram showing an essential part of a fifth embodiment of the semiconductor memory device according to the present invention.

Next, a description will be given of a fifth embodiment of the semiconductor memory device according to the present invention, by referring to FIG. 20. FIG. 20 shows an essential part of the fifth embodiment, and in FIG. 20, those parts which are the same as those corresponding parts in FIGS. 2 through 4 are designated by the same reference numerals, and a description thereof will be omitted.

A plurality of memory cells $MC_1$ through $MC_n$ are connected to the bit lines BL and $\overline{BL}$ as shown in FIG. 20, where n = 3 in this embodiment. The memory cells $MC_1$ through $MC_3$ are respectively connected to main word lines MWL1 through MWL3. The memory cells $MC_1$ through $MC_3$ have the same circuit structure, and the circuit structure shown in FIG. 2, 3 or 17 may be used. In addition, a capacitor C is coupled to the bit line BL between the two adjacent memory cells $MC_1$ and $MC_2$ and between the two adjacent memory cells $MC_2$ and $MC_3$ Similarly, a capacitor C is coupled to the bit line $\overline{BL}$ between the two adjacent memory cells $MC_1$ and $MC_2$ and between the two adjacent memory cells $MC_2$ and $MC_3$.

In this embodiment, the memory cell $MC_1$ is used as a memory cell for storing information, and the memory cells $MC_2$ and $MC_3$ are used as transfer cells for transferring the information from the memory cell $MC_1$ to the sense amplifier SA during the read operation and for transferring the information to the memory cell $MC_1$ during the write operation. In other words, the transfer cells $MC_2$ and $MC_3$ substantially function as the bit lines. For this reason, it is possible to omit the transfer gate transistors shown in FIG. 4, and also omit the bit line contacts.

Figure 21:
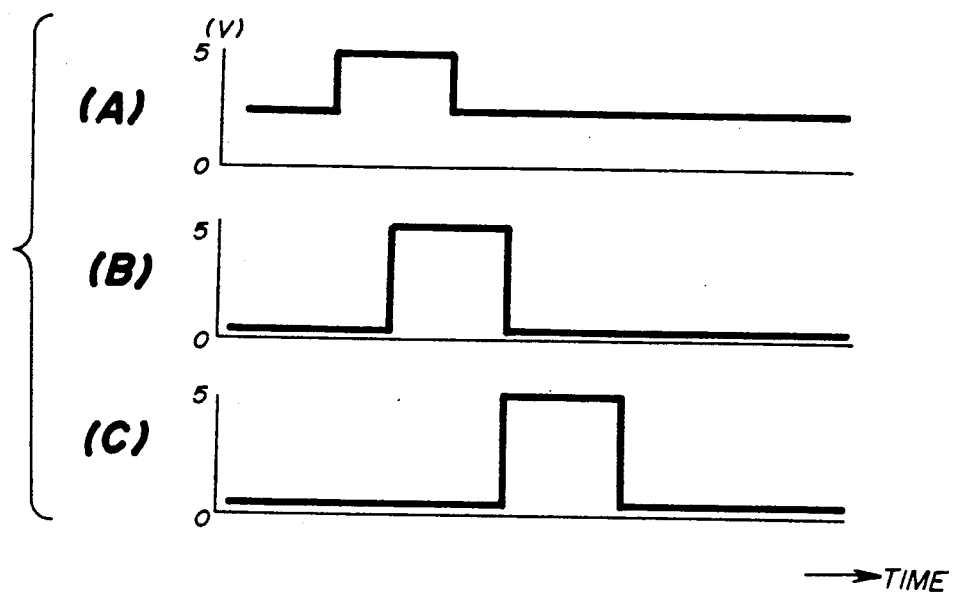
FIG. 21(A) through (C) is a timing chart for explaining a read operation of the fifth embodiment.

FIG. 21(A) through (C) is a timing chart for explaining the read operation of this embodiment. When the memory cell $MC_1$ is not selected, the main word line MWL1 is set to $V_{DD}/2$ which is 2.5 V in this embodiment, as shown in FIG. 15(A). In this state, it is assumed that a node N11 has a high level and a node N12 has a low level. When the memory cell $MC_1$ is selected, the main word line MWL1 is set to $V_{DD}$ which is 5.0 V as shown in FIG. 21(A). As a result, the voltage at the node N11 is changed by $V_{DD}/2$ substantially without changing the voltage at the node N12. This voltage change at the node N11 is transferred to the adjacent memory cell $MC_2$ via the capacitor C and stored in the memory cell $MC_2$ when the corresponding main word line MWL2 is set to $V_{DD}$ as shown in FIG. 21(B). The information stored in the memory cell $MC_2$ is transferred similarly to the memory cell $MC_3$ and then supplied to the sense amplifier SA when the corresponding main word line MWL3 is set to $V_{DD}$ as shown in FIG. 21(C).

Figure 22:
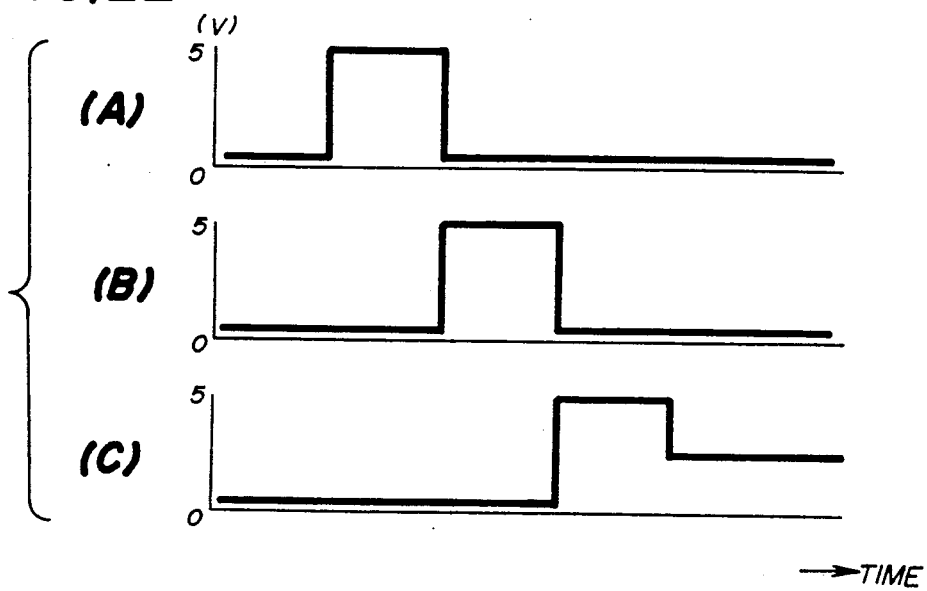
FIG. 22(A) through (C) is a timing chart for explaining a write operation of the fifth embodiment.

FIG. 22(A) through (C) is a timing chart for explaining the write operation of this embodiment. Initially, the main word lines MWL1 through MWL3 are set to the ground level. Depending on the information to be written into the memory cell $MC_1$, the bit line BL at the sense amplifier SA is set to the high level (or low level) and the bit line $\overline{BL}$ at the sense amplifier SA is set to the low level (or high level). Thereafter, the main word lines MWL1, MWL2 and MWL3 are sequentially set to as $V_{DD}$ shown in FIG. 22(A), (B) and (C), so as to transfer the information which is to be stored and finally store the information in the memory cell $MC_1$.

Further, the present invention is not limited to these embodiments, but various variations and modifications may be made without departing from the scope of the present invention.

WHAT IS CLAIMED IS

1. A semiconductor memory device comprising:
at least one memory cell having first and second nodes;
a pair of bit lines coupled to said memory cell;
a first power line which is coupled to said memory cell for supplying a first power source voltage; and
a second power line which is coupled to said memory cell for supplying a second power source voltage,
said memory cell including a first resistor connected between said first power line and said first node, a first transistor connected between said first node and said second power line, a second resistor connected between said first power line and said second node, a second transistor connected between said second node and said second power line, a first capacitor connected between one of said bit lines and said first node, and a second capacitor connected between the other of said bit lines and said second node,
said first transistor having a gate which is connected to said second node,
said second transistor having a gate which is connected to said first node,
one of said first and second power lines being used in common as a word line.

2. The semiconductor memory device as claimed in claim 1, wherein said first power line supplies the first power source voltage which is a positive voltage and said second power line supplies the second power source voltage which is a negative voltage.

3. The semiconductor memory device as claimed in claim 1, which further comprises a sense amplifier which is connected to said bit lines, said sense amplifier amplifying a potential difference across said bit lines.

4. The semiconductor memory device as claimed in claim 3, which further comprises a word line driver coupled to said word line for supplying during a read operation an intermediate voltage when said memory cell is not selected and the first power source voltage when said memory cell is selected and said first power line is used as said word line and the second power source voltage when said memory cell is selected and said second power line is used as said word line, said intermediate voltage being set between the first and second power source voltages.

5. The semiconductor memory device as claimed in claim 4, wherein said word line driver supplies during a write operation the second power source voltage when said memory cell is not selected and said first power line is used as said word line and the first power source voltage when said memory cell is selected and said first power line is used as said word line.

6. A semiconductor memory device comprising:
at least one memory cell having first and second nodes;
a pair of bit lines coupled to said memory cell;
a first power line which is coupled to said memory cell for supplying a first power source voltage; and
a second power line which is coupled to said memory cell for supplying a second power source voltage,
said memory cell including a first transistor connected between said first power line and said first node, a second transistor coupled between said first node and said second power line, a third transistor connected between said first power line and said second node, a fourth transistor coupled between said second node and said second power line, a first capacitor connected between one of said bit lines and said first node, and a second capacitor connected between the other of said bit lines and said second node,
said second transistor having a gate which is connected to said second node,
said fourth transistor having a gate which is connected to said first node,
one of said first and second power lines being used in common as a word line.

7. The semiconductor memory device as claimed in claim 6, wherein said first power line supplies the first power source voltage which is a positive voltage and said second power line supplies the second power source voltage which is a negative voltage.

8. The semiconductor memory device as claimed in claim 6, wherein said first and second transistors form a first complementary metal oxide semiconductor inverter, and said third and fourth transistors form a second complementary metal oxide semiconductor inverter.

9. The semiconductor memory device as claimed in claim 6, which further comprises a sense amplifier which is connected to said bit lines, said sense amplifier amplifying a potential difference across said bit lines.

10. The semiconductor memory device as claimed in claim 9, which further comprises a word line driver coupled to said word line for supplying during a read operation an intermediate voltage when said memory cell is not selected and the first power source voltage when said memory cell is selected and said first power line is used as said word line and the second power source voltage when said memory cell is selected and said second power line is used as said word line, said intermediate voltage being set between the first and second power source voltages.

11. The semiconductor memory device as claimed in claim 10, wherein said word line driver supplies during a write operation the second power source voltage when said memory cell is not selected and said first power line is used as said word line and the first power source voltage when said memory cell is selected and said first power line is used as said word line.

12. The semiconductor memory device as claimed in claim 6, which further comprises a first diode connected between said first node and said second transistor, and a second diode connected between said second node and said fourth transistor.

13. A semiconductor memory device comprising:

a plurality of memory cells each having first and second nodes and divided into a plurality of groups, each of said groups including a predetermined number of said memory cells;

a pair of main bit lines coupled to said memory cells;

a plurality of first power lines which are respectively coupled to said memory cells for supplying a first power source voltage;

a plurality of second power lines which are respectively coupled to said memory cells for supplying a second power source voltage;

a plurality of sub bit line pairs respectively connected to said memory cells, each of said sub bit line pairs being connected to a corresponding one of said groups;

a plurality of sub word lines provided in correspondence with said groups; and transfer gate means coupled to said sub word lines for connecting one of said sub bit line pairs to said main bit lines responsive to signals on said sub word lines, each of said memory cells including a first resistor connected between one first power line and said first node, a first transistor connected between said first node and one second power line, a second resistor connected between said one first power line and said second node, a second transistor connected between said second node and said one second power line, a first capacitor connected between one of said bit lines and said first node, and a second capacitor connected between the other of said bit lines and said second node, said first transistor having a gate which is connected to said second node, said second transistor having a gate which is connected to said first node, one of said one first power line and said one second power line being used in common as a main word line.

14. The semiconductor memory device as claimed in claim 13, wherein said first power lines supply the first power source voltage which is a positive voltage and said second power lines supply the second power source voltage which is a negative voltage.

15. The semiconductor memory device as claimed in claim 13, which further comprises a sense amplifier which is connected to said main bit lines, said sense amplifier amplifying a potential difference across said main bit lines.

16. The semiconductor memory device as claimed in claim 15, which further comprises a word line driver coupled to said main word line for supplying during a read operation an intermediate voltage when said memory cells are not selected and the first power source voltage when said memory cells are selected and said first power line is used as said main word line and the second power source voltage when said memory cells are selected and said second power line is used as said main word line, said intermediate voltage being set between the first and second power source voltages.

17. The semiconductor memory device as claimed in claim 16, wherein said word line driver supplies during a write operation the second power source voltage when said memory cells are not selected and said first power line is used as said main word line and the first power source voltage when said memory cells are selected and said first power line is used as said main word line.

18. A semiconductor memory device comprising:

a plurality of memory cells each having first and second nodes and divided into a plurality of groups, each of said groups including a predetermined number of said memory cells;

a pair of main bit lines coupled to said memory cells;

a plurality of first power lines which are respectively coupled to said memory cells for supplying a first power source voltage;

a plurality of second power lines which are respectively coupled to said memory cells for supplying a second power source voltage;

a plurality of sub bit line pairs respectively connected to said memory cells, each of said sub bit line pairs being connected to a corresponding one of said groups;

a plurality of sub word lines provided in correspondence with said groups; and transfer gate means coupled to said sub word lines for connecting one of said sub bit line pairs to said main bit lines responsive to signals on said sub word lines, each of said memory cells including a first transistor connected between one first power line and said first node, a second transistor connected between said first node and one second power line, a third transistor connected between said one first power line and said second node, a fourth transistor connected between said second node and said one second power line, a first capacitor connected between one of said bit lines and said first node, and a second capacitor connected between the other of said bit lines and said second node, said second transistor having a gate which is connected to said second node, said fourth transistor having a gate which is connected to said first node, one of said one first power line and said one second power line being used in common as a main word line.

19. The semiconductor memory device as claimed in claim 18, wherein said first power lines supply the first power source voltage which is a positive voltage and said second power lines supply the second power source voltage which is a negative voltage.

20. The semiconductor memory device as claimed in claim 18, which further comprises a sense amplifier which is connected to said main bit lines, said sense amplifier amplifying a potential difference across said main bit lines.

21. The semiconductor memory device as claimed in claim 20, which further comprises a word line driver coupled to said main word line for supplying during a read operation an intermediate voltage when said memory cells are not selected and the first power source voltage when said memory cells are selected and said first power line is used as said main word line and the second power source voltage when said memory cells are selected and said second power line is used as said main word line, said intermediate voltage being set between the first and second power source voltages.

22. The semiconductor memory device as claimed in claim 21, wherein said word line driver supplies during a write operation the second power source voltage when said memory cells are not selected and said first power line is used as said main word line and the first power source voltage when said memory cells are selected and said first power line is used as said main word line.

23. The semiconductor memory device as claimed in claim 18, which further comprises a first diode connected between said first node and said second transistor, and a second diode connected between said second node and said fourth transistor.

24. A semiconductor memory device comprising:
a plurality of memory cells each having first and second nodes;
a pair of bit lines coupled to said memory cells;
a first power line which is coupled to said memory cells for supplying a first power source voltage;
a second power line which is coupled to said memory cells for supplying a second power source voltage; and
a plurality of capacitors respectively connected to said bit lines between two adjacent memory cells;
each of said memory cells including a first resistor connected between said first power line and said first node, a first transistor connected between said first node and said second power line, a second resistor connected between said first power line and said second node, a second transistor connected between said second node and said second power line, a first capacitor connected between one of said bit lines and said first node, and a second capacitor connected between the other of said bit lines and said second node,
said first transistor having a gate which is connected to said second node,
said second transistor having a gate which is connected to said first node,
one of said first and second power lines being used in common as a main word line.

25. The semiconductor memory device as claimed in claim 24, wherein said first power line supplies the first power source voltage which is a positive voltage and said second power line supplies the second power source voltage which is a negative voltage.

26. The semiconductor memory device as claimed in claim 24, which further comprises a sense amplifier which is connected to said bit lines, said sense amplifier amplifying a potential difference across said bit lines.

27. A semiconductor memory device comprising:
a plurality of memory cells each having first and second nodes;
a pair of bit lines coupled to said memory cells;
a first power line which is coupled to said memory cells for supplying a first power source voltage;
a second power line which is coupled to said memory cells for supplying a second power source voltage; and
a plurality of capacitors respectively connected to said bit lines between two adjacent memory cells;
each of said memory cells including a first transistor connected between said first power line and said first node, a second transistor connected between said first node and said second power line, a third transistor connected between said first power line and said second node, a fourth transistor connected between said second node and said second power line, a first capacitor connected between one of said bit lines and said first node, and a second capacitor connected between the other of said bit lines and said second node,
said second transistor having a gate which is connected to said second node,
said fourth transistor having a gate which is connected to said first node,
one of said first and second power lines being used in common as a main word line.

28. The semiconductor memory device as claimed in claim 27, wherein said first power line supplies the first power source voltage which is a positive voltage and said second power line supplies the second power source voltage which is a negative voltage.

29. The semiconductor memory device as claimed in claim 27, which further comprises a sense amplifier which is connected to said bit lines, said sense amplifier amplifying a potential difference across said bit lines.

* * * * *